United States Patent
Guo

(10) Patent No.: US 11,384,254 B2
(45) Date of Patent: Jul. 12, 2022

(54) CHEMICAL MECHANICAL POLISHING COMPOSITION CONTAINING COMPOSITE SILICA PARTICLES, METHOD OF MAKING THE SILICA COMPOSITE PARTICLES AND METHOD OF POLISHING A SUBSTRATE

(71) Applicant: Rohm and Haas Electronic Materials CMP Holdings, Inc., Newark, DE (US)

(72) Inventor: Yi Guo, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 16/849,135

(22) Filed: Apr. 15, 2020

(65) Prior Publication Data

US 2021/0324236 A1    Oct. 21, 2021

(51) Int. Cl.
| | |
|---|---|
| *C09G 1/02* | (2006.01) |
| *C09G 1/04* | (2006.01) |
| *H01L 21/304* | (2006.01) |
| *H01L 21/768* | (2006.01) |

(52) U.S. Cl.
CPC ............... *C09G 1/02* (2013.01); *C09G 1/04* (2013.01); *H01L 21/304* (2013.01); *H01L 21/76819* (2013.01)

(58) Field of Classification Search
CPC ....... C09G 1/02; C09G 1/04; H01L 21/76819; H01L 21/304
USPC ........................................ 252/79.1; 438/693
See application file for complete search history.

(56) References Cited

U.S. PATENT DOCUMENTS

| | | | |
|---|---|---|---|
| 2014/0051250 A1* | 2/2014 | Minami | ................ B24B 37/044 |
| | | | 438/693 |
| 2015/0376463 A1* | 12/2015 | Fu | ............................ C09G 1/02 |
| | | | 438/693 |
| 2018/0182485 A1* | 6/2018 | Kubo | ..................... G16H 30/40 |

* cited by examiner

*Primary Examiner* — Duy Vu N Deo
(74) *Attorney, Agent, or Firm* — John J. Piskorski

(57) ABSTRACT

A chemical mechanical polishing composition includes water, colloidal silica abrasive particles with a silica core containing a nitrogen species, a cerium compound coating including cerium oxide, cerium hydroxide or mixtures thereof, and a positive zeta potential, optionally an oxidizing agent, optionally a pH adjusting agent, optionally a biocide and optionally a surfactant. The chemical mechanical polishing composition has a pH of less than 7. Also described is a method of polishing a substrate containing silicon dioxide and a method of making the composite colloidal silica particles with the coating of cerium oxide, cerium hydroxide or mixtures thereof. The chemical mechanical polishing composition can be used to enhance the removal of silicon dioxide from a substrate in an acid environment.

3 Claims, No Drawings

CHEMICAL MECHANICAL POLISHING COMPOSITION CONTAINING COMPOSITE SILICA PARTICLES, METHOD OF MAKING THE SILICA COMPOSITE PARTICLES AND METHOD OF POLISHING A SUBSTRATE

FIELD OF THE INVENTION

The present invention is directed to a chemical mechanical polishing composition containing composite silica particles, method of making the composite silica particles and method of polishing a substrate. More specifically, the present invention is directed to a chemical mechanical polishing composition containing composite silica particles, method of making the composite silica particles and method of polishing a substrate, wherein the composite silica particles comprise a silica core, a nitrogen species, a cerium compound coating comprising cerium oxide, cerium hydroxide or mixtures thereof on the silica core, a positive zeta potential and an acid pH.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by several deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Abrasives are the primary components of chemical mechanical polishing slurries. Silica and ceria nanoparticles are two of the most common compositions. Silica particles are widely used in chemical mechanical polishing because of their availability and long history in glass polishing. More importantly, the use of positively charged silica at acidic pH ranges has enabled an enhanced oxide removal rate at low silica wt %. However, their polishing removal rate and selectivities are often inadequate in ILD and STI processes. Accordingly, there is a need to provide an improved silica for enabling enhanced silicon dioxide removal rate at acid pH.

SUMMARY OF THE INVENTION

The present invention provides a chemical mechanical polishing composition, comprising:
water;
colloidal silica abrasive particles comprising a silica core comprising a nitrogen species, a cerium compound coating comprising cerium oxide, cerium hydroxide or mixtures thereof on the silica core, and a positive zeta potential;
optionally an oxidizing agent;
optionally a pH adjusting agent;
optionally a biocide;
optionally a surfactant; and
a pH less than 7.

The present invention further includes a method of making composite colloidal silica abrasive particles providing:
a chemical mechanical polishing composition comprising:
water;
colloidal silica abrasive particles comprising a nitrogen containing species and a positive zeta potential;
0.0001 wt % to 1 wt % of a source of cerium ions; and
an oxidizing agent;
optionally a biocide;
optionally a surfactant;
adding an alkaline pH adjusting agent to the chemical mechanical polishing composition to provide a pH of greater than 7;
optionally applying heat at temperatures of greater than or equal to 35° C.; and
adjusting the pH of the chemical mechanical polishing composition to less than 7 with an acid pH adjusting agent to form colloidal composite silica particles comprising a silica core comprising a nitrogen species, a cerium compound comprising cerium oxide, cerium hydroxide or mixtures thereof coating the silica core, and a positive zeta potential.

The present invention also provides a method for chemical mechanical polishing of a substrate, comprising:
providing a substrate, wherein the substrate comprises silicon dioxide;
providing a chemical mechanical polishing composition comprising:
water;
colloidal silica abrasive particles comprising a silica core comprising a nitrogen species, a cerium compound coating comprising cerium oxide, cerium hydroxide or mixtures thereof on the silica core, and a positive zeta potential;
optionally an oxidizing agent;
optionally a pH adjusting agent;
optionally a biocide;
optionally a surfactant; and
a pH less than 7;
providing a chemical mechanical polishing pad with a polishing surface;
creating dynamic contact at an interface between the polishing surface of the chemical mechanical polishing pad and the substrate with a down force of 0.69 to 34.5 kPa; and
dispensing the chemical mechanical polishing composition onto the chemical mechanical polishing pad at or near the interface between the chemical mechanical polishing pad and the substrate; and wherein the substrate is polished and some of the silicon dioxide is polished away.

The chemical mechanical polishing composition and method of the present invention enable enhanced silicon dioxide removal rates at an acid pH.

DETAILED DESCRIPTION OF THE INVENTION

As used throughout this specification the following abbreviations have the following meanings, unless the context indicates otherwise: ° C.=degrees Centigrade; mL=milliliters; μ=μm=microns; kPa=kilopascal; Å=angstroms; mm=millimeters; nm=nanometers; min=minute; rpm=revolutions per minute; lbs=pounds; kg=kilograms; wt %=percent by weight; RR=removal rate; ZP=zeta potential; mv=millivolts; Si=silicon; $Si_3N_4$=silicon nitride; DEAMS=(N,N-diethylaminomethyl) triethoxysilane, 98% (Gelest Inc., Morrisville, Pa.); TMOS=tetramethyl orthosilicate; TMAH=tetramethyl ammonium hydroxide; TEA=tetraethyl ammonium; and EDA=ethylenediamine; EOPA=3-ethoxypropylamine; Ti=titanium; TiN=titanium nitride; W=tungsten; PS=Polishing Slurry of the Invention; CS=Comparative Polishing Slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon oxide formed from the decomposition of tetraethyl orthosilicate ($Si(OC_2H_5)_4$). The term "composition" and "slurry" are used interchangeably through-out the specification. The terms "a" and "an" refer to both the singular and the plural. All percentages are by weight, unless otherwise noted. All numerical ranges are inclusive and combinable in any order, except where it is logical that such numerical ranges are constrained to add up to 100%.

The chemical mechanical polishing composition and method of the present invention is useful for polishing a substrate comprising silicon dioxide. The chemical mechanical polishing composition of the present invention comprises (preferably consists of) water, colloidal silica abrasive particles containing a silica core, a nitrogen species, a cerium compound coating comprising cerium oxide, cerium hydroxide or mixtures thereof on the silica core, and a positive zeta potential, optionally an oxidizing agent, optionally a biocide, optionally a surfactant, optionally a pH adjusting agent, and a pH less than 7. Preferably, the cerium compound coating on the silica core consists of a cerium compound selected from the group consisting of cerium oxide, cerium hydroxide and mixtures thereof. More preferably, the cerium compound coating on the silica core of the colloidal silica particles is cerium hydroxide. The silica core comprising a nitrogen species and having a net positive zeta potential wherein the silica core is coated with the cerium compound comprising cerium oxide, cerium hydroxide or mixtures thereof forms the composite colloidal silica particles of the present invention.

The water contained in the chemical mechanical polishing composition of the present invention is preferably at least one of deionized and distilled to limit incidental impurities.

The chemical mechanical polishing composition of the present invention contains 0.1 wt % to 40 wt % colloidal silica abrasive particles containing a silica core, a nitrogen species, a cerium compound coating comprising cerium oxide, cerium hydroxide or mixtures thereof on the silica core and a net positive zeta potential, preferably, 1 wt % to 25 wt % colloidal silica abrasive particles containing a silica core, a nitrogen species, a cerium compound coating comprising cerium oxide, cerium hydroxide or mixtures thereof on the silica core, and a net positive zeta potential, more preferably, 1 wt % to 20 wt %, most preferably, 10 wt % to 20 wt %. The colloidal silica abrasive particles containing a silica core, a nitrogen species and a cerium compound coating on the core and a net positive zeta potential, preferably, have an average particle size of <100 nm, more preferably, 50 to 90 nm, most preferably, 60 to 80 nm, as measured by dynamic light scattering techniques (DLS).

In the chemical mechanical polishing compositions of the present invention, the chemical mechanical polishing compositions provided, contain colloidal silica abrasive particles having a positive zeta potential, wherein the colloidal silica abrasive particles comprise a nitrogen containing species from a nitrogen-containing compound. Such nitrogen-containing compounds can be incorporated within the colloidal silica abrasive particles, or can be incorporated on a surface of the colloidal silica abrasive particles, or the chemical mechanical polishing compositions of the present invention can contain, as initial components, colloidal silica abrasive particles having a combination, wherein the nitrogen-containing compounds are incorporated within the colloidal silica abrasive particles having the positive zeta potential, and, wherein, the nitrogen-containing compounds are incorporated on a surface of the colloidal silica abrasive particles.

Colloidal silica abrasive particles comprising nitrogen-containing compounds are commercially available, or can be prepared by those of ordinary skill in the art as described in the chemical and colloidal silica abrasive particle literature. An example of commercially available colloidal silica particles comprising nitrogen-containing compounds is FUSO™ BS-3 colloidal silica (containing EOPA) (Fuso Chemical Co., Ltd., Osaka, Japan). Such colloidal silica abrasive particles are preferably prepared by the Stober process, well known to those of ordinary skill in the art.

The colloidal silica abrasive particles having a positive zeta potential of the present invention comprise (on a surface of colloidal silica abrasive particles, within colloidal silica abrasive particles, or combinations thereof) nitrogen-containing compounds which include, but are not limited to, ammonium compounds having a general formula:

$$R^1R^2R^3R^4N^+ \quad (I)$$

wherein $R^1$, $R^2$, $R^3$ and $R^4$ are independently chosen from hydrogen, $(C_1\text{-}C_6)$alkyl, $(C_7\text{-}C_{12})$ arylalkyl and $(C_6\text{-}C_{10})$ aryl. Such groups can be substituted with one or more hydroxyl groups. Such colloidal silica abrasives containing ammonium compounds can be prepared from methods known in the art or in the literature.

Examples of such nitrogen-containing ammonium compounds are tetramethylammonium, tetraethylammonium, tetrapropylammonium, tetrabutylammonium, tetrapentylammonium, ethtyltrimethylammonium and diethyldimethylammonium.

Nitrogen-containing compounds can also include, but are not limited to, compounds having an amino group such as a primary amine, a secondary amine, a tertiary amine or a quaternary amine. Such nitrogen-containing compounds can also include an amino acid having from one to eight carbon atoms such as lysine, glutamine, glycine, iminodiacetic acid, alanine, valine, leucine, isoleucine, serine and threonine.

In various embodiments, a weight ratio of the chemical species to silica in the colloidal silica abrasive particles of the present invention is preferably from 0.1 wt % to 10 wt %.

Optionally, but preferably, aminosilane compounds are incorporated on surfaces or into colloidal silica abrasive particles of the chemical mechanical polishing compositions of the present invention. Such aminosilane compounds include, but are not limited to, primary aminosilanes, secondary aminosilanes, tertiary aminosilanes, quaternary aminosilanes and multi-podal (e.g., dipodal) aminosilanes. The aminosilane compound can include substantially any suitable aminosilane. Examples of aminosilanes which can be used to practice the present invention are bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl tiralkoxysilane), aminopropyl trialkoxysilane, (2-N-benzylaminoethyl)-3-aminopropyl trialkoxysilane), trialkoxysilyl propyl-N, N, N-trimethyl ammonium, N-(trialkoxysilylyethyl)benzyl-N,N,N-trimethyl ammonium, (bis(methyldialkoxysiylylpropyl)-N-methyl amine, bis(trialkoxysilylpropyl)urea, bis(3-(triakoxysilyl)propyl)-ethylenediamine, bis(trialkoxysilylpropyl)amine, bis(trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, 3-aminopropyltriethoxysilane, (N-trialkoxysilylpropyl)polyethyleneimine, trialkoxysilylpropoyldiethylentriamine, N-phenyl-3-aminopropyltrialkoxysilane, N-(vinylbenzyl)-2-aminoethyl-3-aminopropyltrialkoxysilane, 4-aminobutyl-trialkoxysilane, (N,N-diethylaminomethyl) triethoxysilane, and mixtures thereof. Those of ordinary skill in the art readily appreciate that aminosilane compounds are commonly hydrolyzed (or partially hydrolyzed) in an aqueous medium. Thus, by reciting an aminosilane compound, it is understood that the aminosilane or a hydrolyzed (or partially hydrolyzed) species or condensed species thereof can be incorporated in the colloidal silica abrasive particles.

In various embodiments, a weight ratio of the aminosilane species to silica in the colloidal silica abrasive particles is preferably from 0.1 wt % to 10 wt %, more preferably, from 0.25 wt % to 9 wt %, even more preferably, from 0.5 wt % to 5 wt %.

Colloidal silica abrasive particles which include nitrogen containing compounds incorporated within the colloidal silica abrasive particles are preferably prepared by the Stober process, wherein organic alkoxysilanes, such as TMOS and TEOS are used as precursors for silica synthesis and nitrogen-containing compounds are used as catalysts. The TMOS and TEOS as precursors undergo hydrolysis and condensation in an aqueous alkaline environment. The catalysts used to maintain an alkaline pH are nitrogen-containing species, such as, but are not limited to, ammonia, TMAH, TEA, EOPA and EDA. As counterions, these nitrogen-containing compounds are inevitably trapped inside the colloidal silica abrasive particles during particle growth, thus resulting in colloidal silica abrasive particles comprising nitrogen-containing compounds internally incorporated within the colloidal silica abrasive particles. Examples of a commercially available colloidal silica abrasive particles which include nitrogen-containing compounds incorporated within the particles are particles available from FUSO™, such as FUSO BS-3™ colloidal silica abrasive particles.

The colloidal silica particles of the present invention containing the nitrogen species and the positive zeta potential comprises a cerium compound coating comprising cerium oxide, cerium hydroxide or mixtures thereof on the core of the composite colloidal silica particles. Preferably, the cerium compound is selected from the group consisting of cerium oxide, cerium hydroxide and mixtures thereof. Most preferably, the cerium coating on the silica core of the composite silica particles is cerium hydroxide. Sources of cerium which provide the cerium ions (cerium (III) and cerium (IV)) for forming the cerium compound coating on the core of the silica particles include, but are not limited to cerium acetate, cerium nitrate, cerium sulfate, cerium chloride, cerium fluoride, cerium bromide, cerium iodide, cerium oxide, ceric ammonium nitrate, ammonium cerium sulfate, cerium hydrate or mixtures thereof.

Sources of cerium ions are included in the chemical mechanical polishing compositions in amounts of 0.0001 wt % to 1 wt %, preferably, from 0.001 wt % to 0.5 wt %, more preferably, from 0.01 wt % to 0.005 wt %, most preferably, from 0.01 wt % to 0.002 wt %.

Optionally, the chemical mechanical polishing compositions provided contain a pH adjusting agent. Such pH adjusting agents include inorganic and carboxylic acids. Inorganic acids include, but are not limited to nitric acid, sulfuric acid, phosphoric acid, or mixtures thereof. Carboxylic acids include monocarboxylic acids and dicarboxylic acids. Monocarboxylic acids include, but are not limited to acetic acid, propionic acid, butyric acid, benzoic acid, or mixtures thereof. Dicarboxylic acids include, but are not limited to malonic acid, oxalic acid, succinic acid, adipic acid, maleic acid, malic acid, glutaric acid, tartaric acid, salts thereof or mixtures thereof. More preferably, the acid chemical mechanical polishing compositions provided contain a dicarboxylic acid, wherein the dicarboxylic acid is selected from the group consisting of malonic acid, oxalic acid, succinic acid, tartaric acid, salts thereof and mixtures thereof. Still more preferably, the acid chemical mechanical polishing compositions provided contain a dicarboxylic acid, wherein the dicarboxylic acid is selected from the group consisting of malonic acid, oxalic acid, succinic acid, salts thereof and mixtures thereof. Most preferably, the acid chemical mechanical polishing compositions provided contain the dicarboxylic acid succinic acid or salts thereof. Such dicarboxylic acids are included in the chemical mechanical polishing compositions to maintain a desired acid pH.

Alkaline compounds which can be used to adjust the pH of the chemical mechanical polishing composition include, but are not limited to ammonia, ammonium hydroxide, potassium hydroxide, sodium hydroxide or mixtures thereof. Such alkaline compounds are included in the chemical mechanical polishing compositions of the present invention in amounts to maintain a desired pH. In general, such alkaline compounds are used to maintain an initial alkaline pH during preparation of the composite colloidal silica particles as described below.

The chemical mechanical polishing compositions used in the chemical mechanical polishing methods of the present invention have a final pH of less than 7, preferably 2 to 6.5, more preferably, 3 to 6, most preferably, 4 to 5. A most preferred pH adjusting agent to maintain the chemical mechanical polishing composition at the desired acid pH range is succinic acid.

Optionally, but preferably, the chemical mechanical polishing compositions of the present invention include an oxidizing agent. Oxidizing agents include, but are not limited to, hydrogen peroxide, monopersulfate, iodates, magnesium perphthalate, peracetic acid, and other per-acids, persulfate, bromates, perbromate, persulfate, peracetic acid, periodate, nitrates, hypochlorites and mixtures thereof. Preferably, the oxidizing agent is selected from the group consisting of hydrogen peroxide, perchlorate, perbromate, periodate, persulfate and per acetic acid. More preferably, the oxidizing agent is hydrogen peroxide.

Preferably, the chemical mechanical polishing composition provided contains 0.0001 wt % to 0.1 wt %, more preferably, 0.001 wt % to 0.05 wt %, even more preferably, 0.0025 wt % to 0.01 wt % of an oxidizing agent.

Optionally, the chemical mechanical polishing compositions can contain biocides, such as KORDEX™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of The Dow Chemical Company). Such biocides can be included in the acid chemical mechanical polishing compositions of the present invention in conventional amounts, as known to those of ordinary skill in the art.

Optionally, the chemical mechanical polishing composition of the present invention includes a surfactant. Such surfactants include but are not limited to non-ionic surfactants such as esters, ethylene oxides, alcohols, ethoxylates, silicon compounds, fluorine compounds, ether, glycosides and their derivatives. Surfactants can also include conventional cationic surfactants.

Surfactants can be included in the chemical mechanical polishing compositions in conventional amounts, such as, but not limited to, of 0.001 wt % to 0.1 wt %, preferably, 0.001 wt % to 0.05 wt %, more preferably, 0.01 wt % to 0.05 wt %, still more preferably, 0.01 wt % to 0.025 wt %.

The present invention further comprises a method of making the colloidal composite silica particles by providing a chemical mechanical polishing composition comprising (preferably consists of) water, colloidal silica abrasive particles comprising a nitrogen species and having a positive zeta potential, 0.0001 wt % to 1 wt % of a source of cerium ions and their counter anions, an oxidizing agent, optionally a biocide, optionally a surfactant, and a pH adjusting agent to initially provide an alkaline pH of greater than 7, then followed by a pH adjusting agent to provide a final acid pH. Preferably, the alkaline pH is 7.5 or greater, more preferably the alkaline pH is from 8 to 12, even more preferably, the alkaline pH is from 8 to 11, most preferably, the alkaline pH is from 8 to 9. The final acid pH is less than 7, preferably 2 to 6.5, more preferably, 3 to 6, most preferably, 4 to 5.

The pH adjusting agents are described above. A most preferred alkaline pH adjusting agent is ammonia. A most preferred pH adjusting agent to maintain the chemical mechanical polishing composition at the desired acid pH range is succinic acid.

Preferably, the colloidal silica particles of the present invention containing the nitrogen species are prepared by a one-pot wet process. The cerium compound coating is prepared by a nucleation, condensation-polymerization, or similar process in aqueous media. This is in contrast to any dry process techniques where a calcining process is typically used to try and anneal cerium oxide from ceria-containing precursors to achieve the crystallinity that is desired, e.g. fumed or pyrogenic ceria. One-pot means the wet-process ceria is formed homogeneously with silica core particle without forming precipitates or phase separation and without requiring the subsequent particle separation and re-dispersion steps.

Preferably, the method of making the colloidal abrasive silica particles of the present invention is by a one-pot wet process by the addition of an oxidizing agent, preferably, hydrogen peroxide, and a source of cerium ions. The mixture is homogenous and the color is observed as red-brownish. The pH is thereafter adjusted to an alkaline range with a pH adjusting agent such as ammonia, ammonium hydroxide, or another alkaline pH agent described above, before aging at elevated temperature for a desired amount of time, as described below. After cooling to room temperature, the slurry appeared to be light yellowish. The slurry is then titrated down to targeted acidic pH for chemical mechanical application. Optionally, the silica particles of the present invention can be treated with aminosilane compounds using conventional processes well known in the art prior to application of the oxidizing agent. The process provides the formation of stable colloidal abrasive silica particles of the present invention.

Including an oxidizing agent in the chemical mechanical polishing composition of the present invention with sources of cerium ions as disclosed above enables the formation of colloidal silica particles of the present invention, wherein the silica particles comprising the nitrogen species and a positive zeta potential have a silica core with a coating comprising cerium oxide, cerium hydroxide, or mixtures thereof. The oxidizing agents of the present invention are disclosed above. Most preferably, the oxidizing agent for forming the cerium compound coated silica particles comprising the nitrogen species and the positive zeta potential of the present invention is hydrogen peroxide.

Optionally, but preferably, the chemical mechanical polishing composition comprising the colloidal silica abrasive particles of the present invention comprising a silica core with a nitrogen species, positive zeta potential and cerium compound coating can be prepared by heating the chemical mechanical polishing composition at temperatures of 35° C. or greater, preferably, from 35° C. to 80° C., more preferably, from 40° C. to 60° C., even more preferably, from 45° C. to 55° C.

Preferably, when the chemical mechanical polishing composition is heated, heating or aging is done for 6 hours to 336 hours, more preferably, from 6 hours to 168 hours, even more preferably, from 6 hours to 24 hours, most preferably, from 6 hours to 12 hours.

The method of making the chemical mechanical polishing composition of the present invention also includes providing a chemical mechanical polishing composition comprising (preferably consists of) water, colloidal silica abrasive particles comprising a nitrogen species, a positive zeta potential, 0.001 wt % to 1 wt % of a source of cerium ions and their counter anions, an oxidizing agent, optionally a biocide, optionally a surfactant, and a pH adjusting agent; providing an alkaline pH adjusting agent to add to the chemical mechanical polishing composition to provide a pH of greater than 7; then heating the chemical mechanical polishing composition at temperatures from 35° C. or greater, preferably, from 35° C. to 80° C., more preferably, from 40° C. to 60° C., even more preferably, from 45° C. to 55° C.; and adding a pH adjusting agent to the chemical mechanical polishing composition to lower the pH below 7 to provide colloidal silica abrasive particles comprising a silica core comprising a nitrogen species, a cerium compound coating comprising cerium oxide, cerium hydroxide or mixtures thereof on the silica particle core and a net positive zeta potential.

The substrate polished in the chemical mechanical polishing method of the present invention comprises silicon dioxide. The silicon dioxide in the substrate includes, but is not limited to, tetraethyl orthosilicate (TEOS), borophosphosilicate glass (BPSG), plasma etched tetraethyl ortho silicate (PETEOS), thermal oxide, undoped silicate glass, high density plasma (HDP) oxide.

Optionally, the substrate polished in the chemical mechanical polishing method of the present invention further comprises silicon nitride. The silicon nitride in the substrate, if present, includes, but is not limited to, silicon nitride material, such as, $Si_3N_4$.

Optionally, the substrate polished in the chemical mechanical polishing method of the present invention also comprises Ti, TiN, W or combinations thereof.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

In the method of polishing a substrate comprising silicon dioxide, silicon nitride, Ti, TiN, W or combinations thereof, polishing is done at a platen speed of 93-113 revolutions per minute, a carrier speed of 87-111 revolutions per minute, an acid chemical mechanical polishing composition flow rate of 125-300 mL/min, a nominal down force of 21.4 kPa (3 psi) on a 200 mm polishing machine; and, wherein the chemical mechanical polishing pad comprises a polyurethane polishing layer containing polymeric hollow core microparticles and a polyurethane impregnated non-woven subpad.

The following examples are intended to illustrate the present invention but are not intended to limit its scope.

In the following Examples, unless otherwise indicated, conditions of temperature and pressure are ambient temperature and standard pressure.

The polishing removal rate experiments were performed on eight-inch blanket wafers. An Applied Materials Mirra® polisher was used for all examples. All polishing experiments were performed using a IC 1000 polyurethane polishing pad with a K7+R32 groove, or VisionPad 6000™ polyurethane polishing pad (commercially available from Rohm and Haas Electronic Materials CMP Inc.) with a down force of 21 kPa (3 psi), an acid chemical mechanical polishing composition flow rate of 200-300 mL/min, a table rotation speed of 93 rpm and a carrier rotation speed of 87 rpm. The removal rates were determined by measuring the film thickness before and after polishing using a KLA-Tencor FX200 metrology tool.

Example 1

Chemical Mechanical Polishing Compositions

The following chemical mechanical polishing compositions are polishing slurries and were prepared by including the components and amounts disclosed in Table 1 below. The components were combined with the balance being deionized water. The intermediate pH was adjusted with ammonia to a pH of 8 followed by adjusting the pH to 5 with succinic acid as shown in Table 2 below.

TABLE 1

| Slurry | Total (wt %) | BS-3[1] (wt %) | Hydrogen Peroxide (wt %) | DEAMS (wt %) | Cerium Nitrate (wt %) |
|---|---|---|---|---|---|
| CS-1 | 100 | 18 | — | 0.075 | 0.01 |
| PS-1 | 100 | 18 | 0.001 | 0.075 | 0.01 |
| PS-2 | 100 | 18 | 0.0025 | 0.075 | 0.01 |
| PS-3 | 100 | 18 | 0.005 | 0.075 | 0.01 |
| PS-4 | 100 | 18 | 0.01 | 0.075 | 0.01 |

[1]FUSO BS-3 ™ nitrogen-containing colloidal silica abrasive particles having a net positive zeta potential (available from Fuso Chemical Company, Ltd., Japan).

TABLE 2

| Slurry | Intermediate pH | pH Titrant | Final pH | pH Titrant |
|---|---|---|---|---|
| CS-1 | 8 | Ammonia | 5 | Succinic acid |
| PS-1 | 8 | Ammonia | 5 | Succinic acid |
| PS-2 | 8 | Ammonia | 5 | Succinic acid |
| PS-3 | 8 | Ammonia | 5 | Succinic acid |
| PS-4 | 8 | Ammonia | 5 | Succinic acid |

Cerium oxide and cerium hydroxide compounds were coated on the silica particles of the present invention and stable homogeneous dispersions of the chemical mechanical polishing compositions of the present invention were formed at the final acidic pH of 5. The final colloidal silica particles included core silica particles comprising a nitrogen species, DEAMS, a positive zeta potential and cerium hydroxide and cerium oxide compounds coating the silica core.

TABLE 3

| Slurry | ZP (mv) | Appearance |
|---|---|---|
| CS-1 | N/A | Gelled |
| PS-1 | 14 | Partial precipitate |
| PS-2 | 16 | Stable dispersion |
| PS-3 | 20 | Stable dispersion |
| PS-4 | 22 | Stable dispersion |

Example 2

The following aqueous chemical mechanical polishing slurries were prepared. The balance of the chemical mechanical polishing compositions was deionized water. The initial pH titrant in each slurry was ammonia to provide an alkaline pH of 8. Following raising the pH to 8, the pH of PS-5, CS-2, CS-3 and CS-4 were reduced to 5 with succinic acid. Slurry PS-6 was aged for 6 hours at 55° C. and the pH of the chemical mechanical polishing composition was reduced to pH of 5 for the final pH during heating.

TABLE 4

| Slurry | Total (wt %) | BS-3 (wt %) | Hydrogen peroxide (wt %) | DEAMS (wt %) | Cerium nitrate | Final pH |
|---|---|---|---|---|---|---|
| CS-2 | 100 | 1.5 | — | 0.0075 | — | 5 |
| CS-3 | 100 | 1.5 | — | — | 0.005 | 5 |
| CS-4 | 100 | 1.5 | 0.002 | — | 0.005 | 5 |
| PS-5 | 100 | 1.5 | 0.002 | 0.0075 | 0.005 | 5 |
| PS-6 | 100 | 1.5 | 0.002 | 0.0075 | 0.005 | 5 |

Cerium oxide and cerium hydroxide were coated on the silica particles of PS-5 and PS-6 and stable homogeneous dispersions of chemical mechanical polishing compositions were formed at the final acidic pH of 5. The final colloidal silica particles included core silica particles comprising a nitrogen species, DEAMS, a positive zeta potential and cerium hydroxide and cerium oxide compounds coating the silica core.

TABLE 5

| Slurry | TEOS RR (Å/min) | SiN RR (Å/min) | Polysilicon RR (Å/min) |
|---|---|---|---|
| CS-2 | 1981 | 159 | 874 |
| CS-3 | 62 | 134 | 1221 |
| CS-4 | 70 | 157 | 1114 |
| PS-5 | 1365 | 164 | 880 |
| PS-6 | 2125 | 244 | 63 |

The chemical mechanical polishing compositions of the present invention (PS-5 and PS-6) showed enhanced TEOS removal rates over SiN and polysilicon removal rates.

Example 3

The following chemical mechanical polishing compositions were prepared having the components disclosed in Table 6 below. The balance of the chemical mechanical polishing compositions was deionized water. The pH of each composition was raised to pH of 8 with ammonia. PS-7 was heat treated for 12 hours at 55° C. The pH titrant for PS-7 and CS-5 was succinic acid. The pH for each composition was lowered to 4.5. Cerium oxide and cerium hydroxide were coated on the silica particles of PS-7 and a stable homogeneous dispersion of a chemical mechanical polishing composition was formed at the final acidic pH of 4.5. The final colloidal silica particles included core silica particles comprising a nitrogen species, DEAMS, a positive zeta potential and cerium hydroxide and cerium oxide compounds coating the silica core.

TABLE 6

| Slurry | Total (wt %) | BS-3 (wt %) | Hydrogen peroxide (wt %) | DEAMS (wt %) | Cerium nitrate (wt %) | Final pH |
|---|---|---|---|---|---|---|
| CS-5 | 100 | 2 | — | 0.01 | — | 4.5 |
| PS-7 | 100 | 2 | 0.002 | 0.01 | 0.002 | 4.5 |

TABLE 7

| Slurry | TEOS RR | SiN RR | W RR | Ti RR | TiN RR |
|---|---|---|---|---|---|
| CS-5 | 3191 | 148 | 55 | 145 | 265 |
| PS-7 | 3126 | 210 | 20 | 36 | 24 |

What is claimed is:

1. A chemical mechanical polishing composition comprising:
   water;
   colloidal silica abrasive particles comprising a silica core comprising a nitrogen species, 0.005 wt % to 0.01 wt % cerium oxide, wherein cerium oxide coats the silica core, and a positive zeta potential;
   an oxidizing agent;
   optionally a pH adjusting agent;
   optionally a biocide;
   optionally a surfactant; and
   a pH less than 7.

2. The chemical mechanical polishing composition of claim 1, wherein the silica core of the abrasive particles further comprises an aminosilane compound.

3. The chemical mechanical polishing composition of claim 1, wherein the oxidizing agent is hydrogen peroxide.

* * * * *